United States Patent [19]

Shigeo et al.

[11] Patent Number: 4,918,339

[45] Date of Patent: Apr. 17, 1990

[54] DATA OUTPUT CIRCUIT

[75] Inventors: Ohshima Shigeo, Tokyo; Toda Haruki, Yokohama, both of Japan

[73] Assignee: Kabushiki Kaisha Toshiba, Kanagawa, Japan

[21] Appl. No.: 167,081

[22] Filed: Mar. 11, 1988

[30] Foreign Application Priority Data

Mar. 23, 1987 [JP] Japan .................................. 62-68242

[51] Int. Cl.⁴ ..................... H03K 17/06; H03K 17/16; H03K 19/003; H03K 17/687
[52] U.S. Cl. .................................. 307/542; 307/443; 307/263; 307/242
[58] Field of Search ............... 307/443, 542, 246, 242, 307/591, 592, 594, 595, 597, 603, 605, 547, 548, 549, 555, 584, 571, 448, 450, 264, 270, 263

[56] References Cited

U.S. PATENT DOCUMENTS

| | | | |
|---|---|---|---|
| 4,063,117 | 12/1977 | Laugesen et al. | 307/595 X |
| 4,694,207 | 9/1987 | Heuwieser et al. | 307/242 X |
| 4,719,369 | 1/1988 | Asano et al. | 307/443 |
| 4,725,747 | 2/1988 | Stein et al. | 307/263 X |
| 4,771,195 | 9/1988 | Stein | 307/443 X |
| 4,777,389 | 10/1988 | Wu et al. | 307/263 X |
| 4,779,013 | 10/1988 | Tanaka | 307/263 X |
| 4,783,604 | 11/1988 | Ueno | 307/443 X |
| 4,785,201 | 11/1988 | Martinez | 307/263 X |
| 4,785,203 | 11/1988 | Nakamura | 307/542 X |
| 4,789,796 | 12/1988 | Foss | 307/443 |

Primary Examiner—Stanley D. Miller
Assistant Examiner—David R. Bertelson
Attorney, Agent, or Firm—Banner, Birch, McKie & Beckett

[57] ABSTRACT

When low-level data is output from a data output terminal, a plurality transistors, whose source-drain paths are inserted in parallel between the data output terminal and a power source terminal, begin to conduct at successively different time-points. Thus, the potential fluctuations produced in the power source voltage are dispersed over time, avoiding circuit component malfunction. Further reduction in noise can be achieved by making the gate drive voltage of the first transistor which conducts in a switching cycle when low-level data is output, smaller than that of the remaining transistors in the switching cycle, so that its current when conducting becomes smaller.

18 Claims, 4 Drawing Sheets (a)

(b)

DATA OUTPUT CIRCUIT

BACKGROUND OF THE INVENTION

1. Field of the Invention

This invention generally relates to a data output buffer circuit for a semiconductor integrated circuit, and in particular, it relates to a data output buffer circuit suitable for semiconductor memories wherein high access speed is required.

2. Description of the Prior Art

This application is related to commonly assigned Ser. No. 023,577 entitled "Buffer Circuit" filed Mar. 9, 1987. This application is also related to a commonly assigned application entitled "Semiconductor Integrated Circuit Having a Data Output Buffer Circuit" filed concurrently herewith and assigned Ser. No. 167,082.

When data is output from semiconductor integrated circuits such as semiconductor memories, the output load must be charged and discharged at high speed. During this charging and discharging, potential fluctuations, i.e. noise, are generated in the power source voltage and the reference voltage respectively. When low-level data is output in a typical semiconductor integrated circuit (discharging of output load), the potential fluctuations generated in the reference voltage are at least equal to, and usually greater than, the potential fluctuations generated in the power source voltage when high-level data is output (charging of output load). Such fluctuations or noise during these operations are a factor which may cause a malfunction of the semiconductor integrated circuit. The major part of the potential fluctuations generated in the reference voltage during the sudden discharge of the output load consists of the product $L \cdot di/dt$ where $di/dt$ is the rate of increase with time of discharge current to the reference voltage and L is the parasitic inductive component on the discharge path. Since the discharge of the output load occurs rapidly, this product may take on large values, increasing the danger of circuit malfunction.

FIG. 1 is the circuit diagram of a conventional data output circuit for a semiconductor integrated circuit such as a semiconductor memory. In the Figure, the area enclosed by broken lines contains the semiconductor circuit components and the associated output buffer. These semiconductor circuit components may include memory cells, address circuitry, sensing amplifiers, and circuitry for driving the output buffers. It is generally understood that output buffers do not comprise a portion of the internal semiconductor components. This convention will be observed in what follows, i.e., the output buffer is considered distinct from the internal semiconductor circuit components. T1 is a data output terminal. T2 is a power source terminal supplied with power source voltage $V_{DD}$. T3 is a reference terminal supplied with reference voltage $V_{SS}$. I/O and I/O are internal data buses. Transistor 11 is a data output buffer for high-level output and transistor 12 is a data output buffer for low-level output. AND gates 13 and 14 control the respective data outputs and comprise circuitry for driving the output buffers. Parasitic resistive components 15 and 16 are present in the power source wirings. D.C. power source 17 feeds power source voltage $V_{DD}$ to the integrated circuit. Capacitance 18 stabilizes D.C. power source 17. Load capacitance 19 is driven by the output data of the integrated circuit. Resistive components 20, 21, 22 and inductive components 23, 24, 25 are present in the respective wirings of the external part of the integrated circuit.

When such a data output circuit outputs low-level data, internal data bus I/O becomes level "0", and I/O becomes level "1". Subsequently, the internal control signal $\phi_{out}$ rises to level "1", causing the output signal of AND gate 14 to become level "1". As a result, transistor 12 for low-level output, whose source-drain path is inserted between data output terminal T1 and reference terminal T3, is turned on and conducts. Thus, load capacitance 19 discharges to level "0" through terminal T1. The waveforms of the various signals in this series of operations are shown by the continuous lines in the waveform plot of FIG. 2(a). Signal N in FIG. 2(a) is the output signal of AND gate 14. When the load capacitance 19 is discharged, a large discharge current $I_d$ is generated through transistor 12, and potential fluctuations commonly called overshoot, as described above, occur on the reference voltage side due to resistive components 20, 16, 22 and inductive components 23, 25 present on the current path. When such fluctuations occur on the ground voltage side ($V_{SS}$ side), similar fluctuations also occur on the power source voltage side ($V_{DD}$ side). These potential fluctuations are shown by the continuous lines in the wave form plot of FIG. 2(b). Such fluctuations are particularly severe in an integrated circuit having a plurality of data output terminals when a low-level data is output from all terminals. Thus, the possibility of circuit component malfunction becomes very high. Conventionally, however, as shown in FIG. 1, only one low-level output transistor is provided for a single data output terminal. In these circumstances, the only option available for controlling the generation of the overshoot is to greatly restrict the current drive capacity of transistor 12, either by decreasing its channel width W, or by slowing down the rate of increase of its gate drive signal. The fluctuations of the reference and power source potentials in response to these methods are indicated by the broken line in FIG. 2(b). However, as shown by the broken lines in FIG. 2(a), if the rate of increase of the gate drive signal N of transistor 12 is too slow, the change in the signal waveform of terminal T1 is delayed, impairing the high-speed characteristics of the semiconductor memory. A similar effect occurs if the channel width W of transistor 12 is reduced. Thus the conventional circuit is subject to the drawback that the attempts to prevent malfunction by reducing potential fluctuations in the power source have resulted in increased access time.

BRIEF SUMMARY OF THE INVENTION

Accordingly, it is an object of the present invention to provide a data output circuit wherein the potential fluctuations generated in the power source may be reduced without impairing high-speed data access.

It is another object of the present invention to provide a data output circuit which is suitable for high speed memory.

According to the invention, a buffer circuit is provided for a semiconductor integrated circuit, the buffer circuit including a power source voltage having first and second power source terminals, an input terminal for receiving an input signal from the integrated circuit, and an output terminal for outputting an output signal in response to the input signal. The buffer circuit comprises a plurality of transistors having first and second states which are coupled in parallel between the output terminal and the second power source terminal. A transistor switch control means switches each of the transistors in sequence during a switching cycle from its first state to its second state. The transistor switch control means further includes delay means for delaying the switching of at least one transistor to its second state. A transistor voltage control means supplies a lower voltage to the control gate of the first transistor switched during a switching cycle than the voltage applied to the control gates of the remaining transistors in the switching cycle.

BRIEF DESCRIPTION OF THE DRAWINGS

A more complete appreciation of the invention and many of the attendant advantages thereof will be readily obtained as the invention becomes better understood by reference to the following detailed description when considered in connection with the accompanying drawings, wherein.

DETAILED DESCRIPTION OF THE PREFERRED EMBODIMENT

Figure 3:
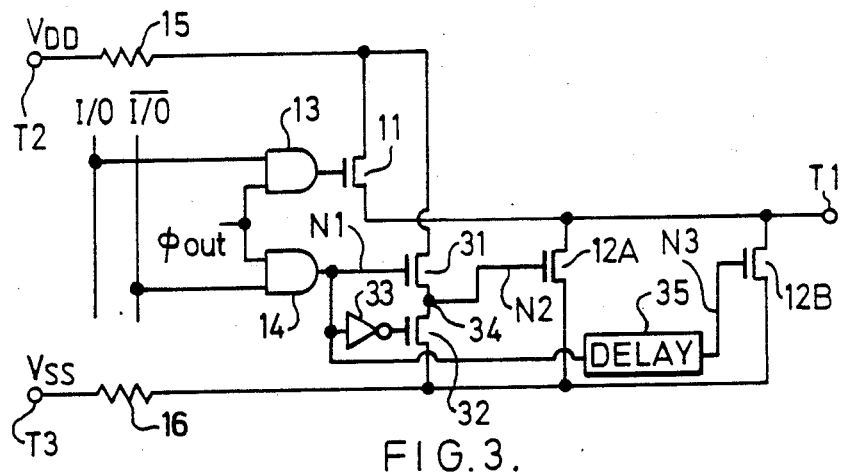
FIG. 3 shows the circuit diagram of a preferred embodiment of the present invention.
Figure 5:
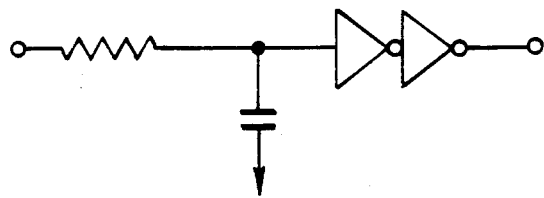
FIG. 5 shows a detailed delay circuit used in the circuit shown in FIG. 3.

FIG. 3 is a circuit diagram showing a construction of this invention applied to the data output circuit of a semiconductor memory. In this Figure, T1 is a data output terminal. T2 is a power source terminal coupled to reference voltage $V_{SS}$. I/O and Ī/O are internal data buses. Transistor 11 is a data output buffer for high-level output and transistor 12 is a data output buffer for low-level output. AND gates 13 and 14 control the respective data outputs and comprise circuitry for driving the output buffers. Parasitic resistive components 15 and 16 are present in the power source wirings. In the circuit of this embodiment, transistor 12 for low-level output comprises two transistors 12A and 12B, one electrode of each being coupled to data output terminal T1, with the other electrode of each being coupled to reference terminal T3. Transistors 31 and 32 are connected in series between power source terminal T2 and reference terminal T3. The output signal of AND gate 14 is fed to the gate of transistor 31 directly and the output signal of AND gate 13 is fed to the control gate of transistor 11 for high-level output in the conventional manner. All the above transistors are N-type. Signal delay circuit 35 applies a predetermined time delay to the output signal of AND gate 14. It may consist, for example, of an RC time-constant circuit having a resistance and capacitance or the signal delay of a gate circuit may be utilized. FIG. 5 shows one example of signal delay circuit 35.

Figure 1:
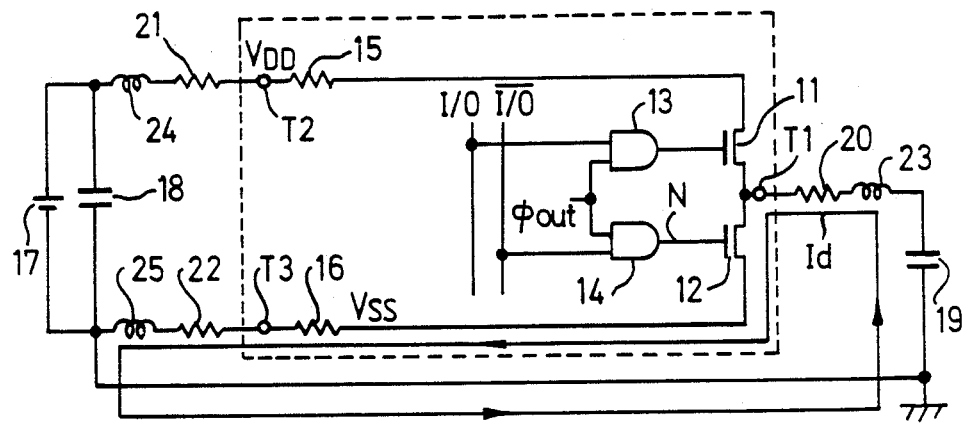
FIG. 1 shows the circuit diagram of a conventional circuit.
Figure 2:
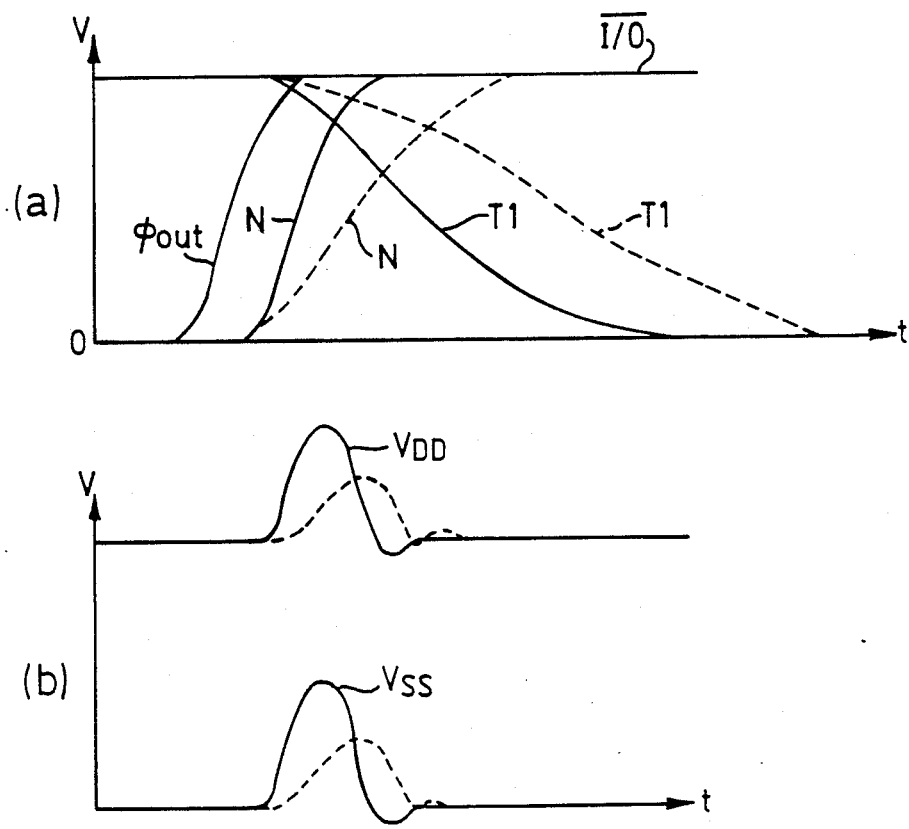
FIGS. 2(a) and 2(b) shows waveforms associated with the operation of the conventional circuit.
Figure 4:
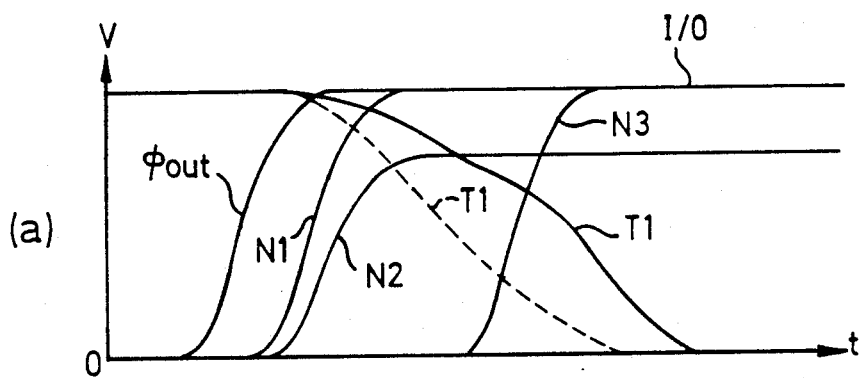
FIGS. 4(a) and 4(b) shows waveforms associated with the operation of the circuit shown in FIG. 3.
Figure 4:
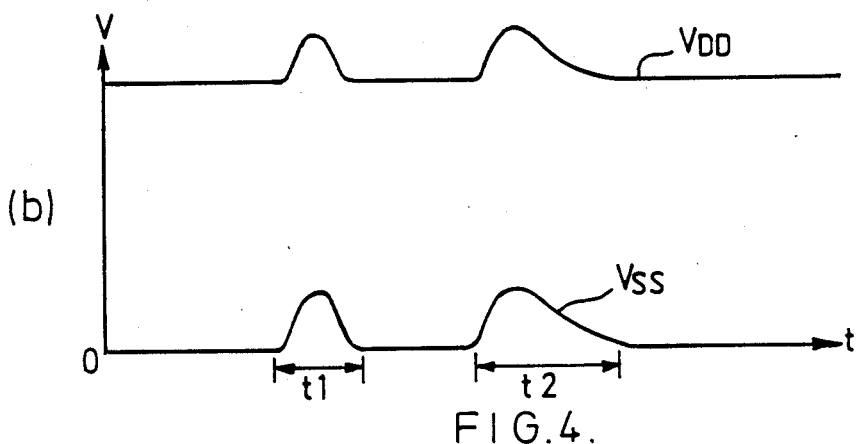

The operation of a circuit constructed as described above will now be discussed with reference to the waveform of FIG. 4(a). In the waveform of FIG. 4(a), φ out is an internal control signal which is supplied to AND gates 13 and 14. N1 is the output signal of AND gate 14. N2 is the signal at point 34 along the series connection of transistors 31 and 32, i.e. the gate signal of transistor 12A. N3 is the output signal of delay circuit 35. In such a data output circuit, internal data bus I/O becomes level "0" and Ī/O becomes level "1". Subsequently, the internal control signal φ out rises to level "1", causing the output signal N1 of AND gate 14 to rise to level "1". As a result transistor 31 conducts, and signal N2 rises to a level "1" through transistor 31. This level "1" signal is at a voltage $V_{DD}-V_t$, i.e. lower than the power source voltage $V_{DD}$ by an amount equal to the threshold voltage of transistor 31. This voltage is input to the control gate of transistor 12A as signal N2. Since this voltage $V_{DD}-V_t$ is sufficiently higher than the threshold voltage of the N-type MOS transistor 12A, transistor 12A conducts, and load capacitance 19 (shown in FIG. 1) which is connected via terminal T1, discharges to level "0". When load capacitance 19 discharges, only a small current flows in transistor 12A. The potential fluctuations or overshoot produced on the ground voltage side ($V_{SS}$ side) and power source voltage side ($V_{DD}$ side) by the parasitic resistive and inductive components present on the current path is greatly reduced in comparison with the conventional case, shown in FIG. 4. Output signal N3 of delay circuit 35 rises to level "1" with a predetermined time delay after signal N1 has risen to level "1". The voltage of this signal N3 is sufficiently higher than the threshold voltage of transistor 12B, so that transistor 12B conducts. This creates an additional discharge path for the load capacitance coupled with terminal T1. The increase of the discharge current due to transistor 12B is slight, so the potential fluctuations or overshoot generated on the reference and power source voltage sides by the parasitic resistive and inductive components present along the current path is greatly reduced from the conventional case as shown in FIG. 4. Thus when level "0" data is output, the periods for which potential fluctuations are generated on the ground and the power source voltage sides are dispersed to periods t1 and t2 as shown in FIG. 4. Furthermore, the values of the discharge currents which start to flow during each period are smaller than in the conventional case, and the extent of the fluctuations produced during the respective periods t1 and t2 are decreased. Malfunction of the circuit components due to power souce potential fluctuations may therefore be avoided. Though the access time is somewhat longer than that of the conventional circuit, as shown by the broken line in FIG. 4(a), it can be made sufficiently rapid compared with the prior art technique of decreasing the rate of increase of the gate drive signal as shown by the broken line in FIG. 2(a). In addition, the gate drive voltage of transistor 12A, which conducts first in the switching sequence of a given switching cycle, is lower than the gate drive voltage of transistor 12B, which starts to conduct next in the sequence, by an amount equal to the threshold voltage of a single transistor. Sequence as used herein refers to any predetermined order. The current drive capability of transistor 12A is thus reduced, but the extent of the potential fluctuations when transistor 12A starts to conduct, and the time period over which they are produced, is diminished. Moreover, after level "0" data is output, the internal control signal φ out falls to level "0", and the output signal N1 of AND gate 14 also falls to level "0". As a result, transistor 31 turns off, and signal N2 also falls to level "0". However, when signal N1 reaches level "0", the output signal of inverter 33 rises to level "1", causing transistor 32 to turn on and conduct. Consequently, the gate of transistor 12A discharges to level "0", with the result that transistor 12A does not conduct.

Figure 6:
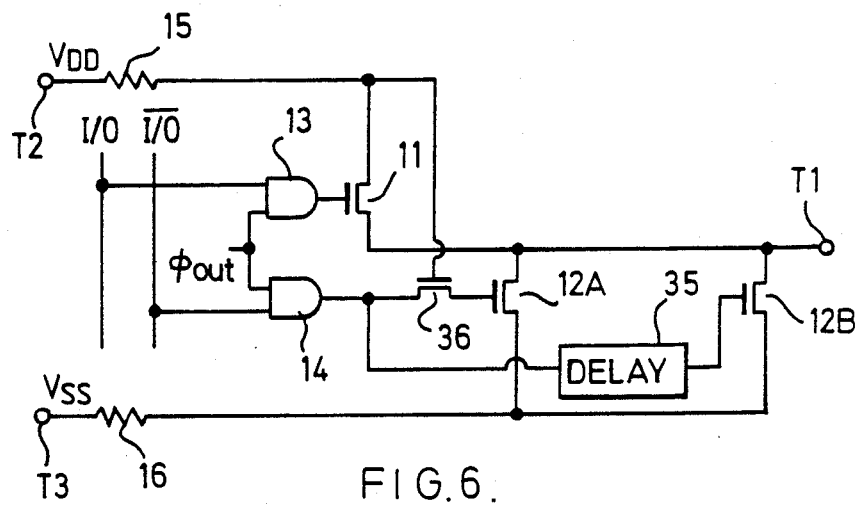
FIGS. 6 and 7 show the circuit diagram of other embodiments according to the present invention.

FIG. 6 is a circuit diagram showing the construction of a data output circuit of a further embodiment of the invention. In the circuit, a voltage lower than the level "1" voltage $V_{DD}$ of the output signal of AND gate 14 by an amount equal to the threshold voltage of one transistor is fed to the gate of transistor 12A. This is accomplished by inserting transistor 36 between the output of AND gate 14 and the control gate of transistor 12A. The results obtained with the circuit of this embodiment are thus the same as those of the circuit of FIG. 3.

Figure 7:
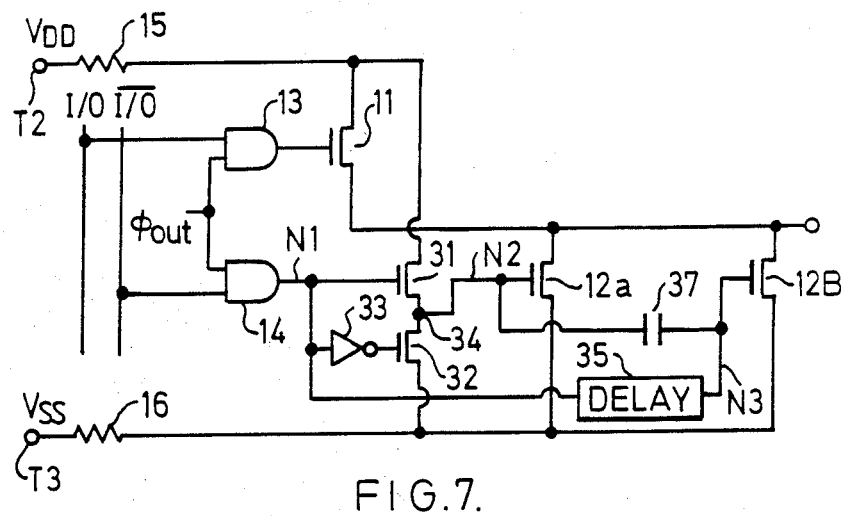
Figure 8:
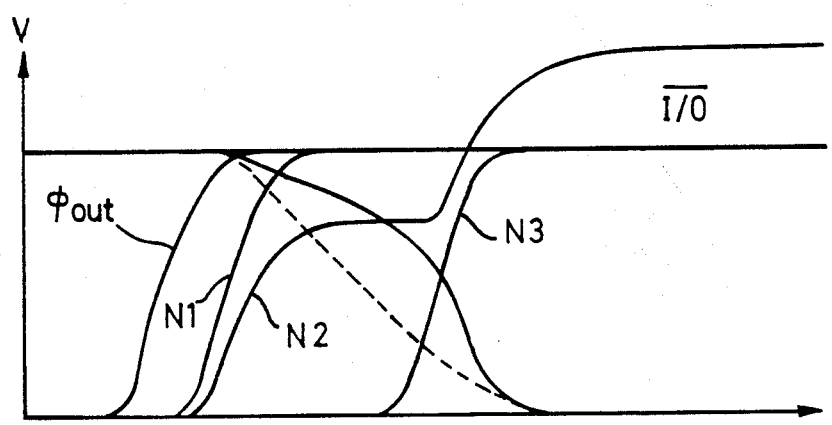
FIG. 8 shows waveforms associated with the operation of the circuit shown in FIG. 7.

FIG. 7 is a circuit diagram showing the construction of a data output circuit of yet a further embodiment of the invention. In this circuit, the output signal of signal delay circuit 35 is coupled to the gate of transistor 12A through a capacitance 37. In such a construction, when the output signal N3 of delay circuit 35 rises to level "1", and transistor 12B conducts, as shown by the waveform of FIG. 8, the voltage of the gate signal N2 of transistor 12A is pulled up to $V_{DD}$ or more by means of capacitance 37. Consequently, the current drive capability of transistor 12A, which had been reduced when the gate voltage fell below $V_{DD}$, is greatly increased. The increase in access time is thus reduced to a minimum.

The invention is not limited to the above embodiments, but may of course be modified in various ways. For example, the above description was for the case wherein two output transistors 12 were provided for level "0" output. However, more than two may be used. Through the above embodiments, the potential fluctuations generated in the power source voltage may be reduced without impairing high-speed data access. This is particularly beneficial when used in high speed DRAMs.

This invention has been described in detail in connection with the preferred embodiments, but these are example only and the invention is not restricted thereto. It will be easily understood, by those skilled in the art, that other variations and modifications may be easily made within the scope of this invention.

We claim:

1. For a semiconductor integrated circuit, a buffer circuit having a power source voltage with first and second power source terminals, an input terminal for receiving an input signal from the integrated circuit, and an output terminal for outputting an output signal in response to the input signal comprising:
a plurality of transistors having first and second states coupled in parallel between said output terminal and said second power source terminal;
transistor switch control means for switching each of said plurality of transistors in sequence during a switching cycle from its first state to its second state, said transistor switch control means including delay means for delaying the switching of at least one of said plurality of transistors to its second state; and
transistor voltage control means for at least initially supplying a voltage to the control gate of the first transistor switched during the switching cycle which is lower than the voltage supplied to the control gates of the remaining transistors in the switching cycle.

2. The buffer circuit according to claim 1 wherein said transistor voltage control means comprises two transistors connected in series with each other and with the power source voltage.

3. The buffer circuit according to claim 2 wherein the control gate of the first transistor switched during the switching cycle is coupled to a point between the two transistors comprising the transistor voltage control means.

4. The buffer circuit according to claim 1 wherein said transistor voltage control means comprises a transistor whose control gate is coupled to the power source voltage and whose electrodes are coupled to the transistor switch control means and the control gate of the first transistor switched during the switching cycle.

5. The buffer circuit according to claim 1 further comprising a capacitor coupled between said delay means and the control gate of the first transistor switched during the switching cycle.

6. The buffer circuit according to claim 1 wherein said plurality of transistors comprises two transistors.

7. A buffer circuit for a semiconductor integrated circuit comprising:
first and second power source terminals;
a data output terminal;
a gate circuit having an output terminal;
first and second enhancement type MOS transistors connected in series between said first and second power source terminals, the control gate of said first enhancement type MOS transistor being coupled to the output terminal of said gate circuit directly, the control gate of said second enhancement type MOS transistor being coupled to the output of said gate circuit through an inverter;
a third MOS transistor coupled between said data output terminal and said second power source terminal, the control gate of said third MOS transistor being coupled to a point between the series-connected first and second MOS transistors;
a fourth MOS transistor coupled between the data output terminal and the second power source terminal and in parallel with said third MOS transistor; and
a signal delay circuit having input and output terminals, the input terminal of said signal delay circuit being coupled to the output terminal of said gate circuit, the output terminal of said signal delay circuit being coupled to the control gate of said fourth MOS transistor, the voltage of said output terminal of said signal delay circuit when said fourth MOS transistor conducts being higher than the voltage of the point between said series-connected first and second MOS transistors when said first and second MOS transistors conduct.

8. The buffer circuit according to claim 7 further comprising:
a capacitor coupled between the output terminal of said signal delay circuit and the control gate of said third MOS transistor.

9. A buffer circuit for a semiconductor integrated circuit comprising:
first and second power source terminals;
a data output terminal;
a gate circuit having an output terminal;
a first and second MOS transistor coupled in parallel between said data output terminal and said second power source terminal;

an enhancement type MOS transistor coupled between the output terminal of said gate circuit and the control gate of said first MOS transistor, the control gate of said enhancement type MOS transistor being coupled to said first power source terminal; and a signal delay circuit having input and output terminals, the input terminal of said signal delay circuit being coupled to the output terminal of said gate circuit, the output terminal of said signal delay circuit being coupled to the control gate of said second MOS transistor.

10. In a buffer circuit for a semiconductor integrated circuit, the buffer circuit having a power source voltage with first and second power source terminals, an input terminal for receiving an input signal from the integrated circuit, an output terminal for outputting an output signal in response to the input signal, and a plurality of transistors having first and second states coupled in parallel between said output terminal and said second power source terminal, a method for reducing the voltage variation of the power source voltage applied to the buffer circuit comprising the steps of:

switching each of said transistors in sequence during a switching cycle from its first state to its second state;

successively delaying the switching of each transistor to its second state; and supplying a lower voltage to the control gate of the first transistor switched during the switching cycle than the the voltage supplied to the control gates of the remaining transistors in the switching cycle.

11. For a semiconductor integrated circuit, a buffer circuit having a power source voltage with first and second power source terminals, an input terminal for receiving an input signal from said semiconductor integrated circuit, and an output terminal for outputting an output signal in response to the input signal, said buffer circuit comprising:

a plurality of transistors having first and second states coupled in parallel between said output terminal and said second power source terminal;

transistor switch control means for switching each of said plurality of transistors in sequence during a switching cycle from its first state to its second state, said transistor switch control means including delay means for delaying the switching of at least one of said plurality of transistors to its second state; and transistor voltage control means for supplying a first predetermined voltage for a first predetermined period to the control gate of the first transistor switched during the switching cycle and subsequently supplying a second predetermined voltage for a second predetermined period to the control gates of the remaining transistors during the switching cycle wherein said first predetermined voltage is lower than said second predetermined voltage.

12. The buffer circuit according to claim 11 wherein said transistor voltage control means comprises two transistors connected in series with each other and with the power source voltage.

13. The buffer circuit according to claim 12 wherein the control gate of the first transistor switched during the switching cycle is coupled to a point between the two transistors comprising the transistor voltage control means.

14. The buffer circuit according to claim 11 wherein said transistor voltage control means comprises a transistor whose control gate is coupled to the power source voltage and whose electrodes are coupled to the transistor switch control means and the control gate of the first transistor switched during the switching cycle.

15. The buffer circuit according to claim 11 further comprising a capacitor coupled between said delay means and the control gate of the first transistor switched during the switching cycle.

16. The buffer circuit according to claim 11 wherein said plurality of transistors comprises two transistors.

17. In a buffer circuit for a semiconductor integrated circuit, the buffer circuit having a power source voltage with first and second power source terminals, an input terminal for receiving an input signal from said semiconductor integrated circuit, an output terminal for outputting an output signal in response to the input signal, and a plurality of transistors having first and second states coupled in parallel between said output terminal and said second power source terminal, a method for reducing the voltage variation of the power source voltage applied to the buffer circuit comprising the steps of:

switching each of said transistors in sequence during a switching cycle from its first state to its second state;

successively delaying the switching of each transistor to its second state;

supplying a first predetermined voltage for a first predetermined period to the control gate of the first transistor switched during the switching cycle; and supplying a second predetermined voltage for a second predetermined period to the control gates of the remaining transistors switched during the switching cycle wherein said first predetermined voltage is less than the second predetermined voltage.

18. For a semiconductor integrated circuit, a buffer circuit having a power source voltage with first and second power source terminals, an input terminal for receiving an input signal from said semiconductor integrated circuit, and an output terminal for outputting an output signal in response to the input signal comprising:

a plurality of transistors having first and second states coupled in parallel between said output terminal and said second power source terminal;

transistor switch control means for switching each of said plurality of transistors in sequence from its first state to its second state during a switching cycle, said transistor switch control means including delay means for delaying the switching of at least one of said plurality of transistors to its second state; and transistor voltage control means for initially supplying a first predetermined voltage for a first predetermined period to the control gate of the first transistor switched during the switching cycle and subsequently supplying a second predetermined voltage which is greater than said first predetermined voltage for a second predetermined period to the control gates of the remaining transistors switched during the switching cycle and raising said first predetermined voltage above said second predetermined voltage.

* * * * *